(12) United States Patent
Kawakami et al.

(10) Patent No.: US 7,846,346 B1
(45) Date of Patent: Dec. 7, 2010

(54) PROCESSING APPARATUS AND METHOD

(75) Inventors: Eigo Kawakami, Utsunomiya (JP);
Hirohisa Ota, Kawagoe (JP); Takashi Nakamura, Edogawa-ku (JP);
Kazuyuki Kasumi, Utsunomiya (JP);
Toshinobu Tokita, Yokohama (JP)

(73) Assignee: Canon Kabushiki Kaisha (JP)

( * ) Notice: Subject to any disclaimer, the term of this patent is extended or adjusted under 35 U.S.C. 154(b) by 1086 days.

(21) Appl. No.: 11/531,856

(22) Filed: Sep. 14, 2006

(30) Foreign Application Priority Data

Sep. 14, 2005 (JP) ............................. 2005-266195

(51) Int. Cl.
*B44C 1/22* (2006.01)
(52) U.S. Cl. ............................. 216/44; 216/41; 216/48
(58) Field of Classification Search ................... 216/22, 216/41, 40, 44, 48; 438/780, 781
See application file for complete search history.

(56) References Cited

U.S. PATENT DOCUMENTS

| | | | |
|---|---|---|---|
| 5,266,136 A * | 11/1993 | Kanome et al. | 156/150 |
| 6,069,931 A | 5/2000 | Miyachi et al. | |
| 6,284,345 B1 * | 9/2001 | Ruoff | 428/143 |
| 6,804,323 B2 | 10/2004 | Moriya et al. | |
| 2005/0266693 A1 * | 12/2005 | Maekawa | 438/720 |
| 2005/0282402 A1 * | 12/2005 | Kim | 438/780 |

FOREIGN PATENT DOCUMENTS

| | | |
|---|---|---|
| JP | 2003-7597 | 1/2003 |
| JP | 3450631 | 7/2003 |
| JP | 2004-288811 | 10/2004 |

OTHER PUBLICATIONS

Colburn et al., "Step and Flash Imprint Lithography: A New Approach to High-Resolution Patterning", Texas Materials Institute, The University of Texas, Austin, TX, Proceedings of the SPIE 24th International Symposium on Microlithography: Emerging Lithographic Technologies III, Santa Clara, CA, vol. 3676, Part One, pp. 379-389, Mar. 1999.

* cited by examiner

*Primary Examiner*—Lan Vinh
(74) *Attorney, Agent, or Firm*—Rossi, Kimms & McDowell LLP

(57) ABSTRACT

A processing method for transferring a relief pattern of a mold to a resist includes the steps of compressing the mold having the relief pattern against the resist on a substrate, irradiating an exposure light onto the resist through the mold, vibrating the mold and the substrate relative to each other during the irradiating step, and releasing the mold from the resist.

11 Claims, 16 Drawing Sheets

PRIOR ART

PRIOR ART

PROCESSING APPARATUS AND METHOD

BACKGROUND OF THE INVENTION

The present invention relates to a processing apparatus and method, and more particularly to a processing apparatus and method for transferring a pattern of a mold as an original to a plate, such as a wafer. The present invention is particularly suitable for a processing apparatus that utilizes the nanoimprint technology as fine processing to manufacture a semiconductor, a Micro Electro-Mechanical Systems ("MEMS"), etc.

The nanoimprint lithography has already been known as one alternative technology to the photolithography that uses the ultraviolet ("UV") light, X-rays and electron beams to form a fine pattern for a semiconductor device. The nanoimprint lithography is a technology that transfers a pattern to a resist by pressing a model or mold having a fine pattern against a substrate, such as a wafer, to which a resinous material or the resist is applied.

The nanoimprint has several types, and one method is a photo-curing method. See, for example, M. Colburn et al., "Step and Flash Imprint Lithography: A New Approach to High-Resolution Patterning", Proceedings of the SPIE's 24th International Symposium on Microlithography: Emerging Lithographic Technologies III, Santa Clara, Calif., Vol. 3676, Part One, pp. 379-389, March 1999. The photo-curing method is a method of exposing and curing the UV curable resin as the resist while pressing a transparent mold against it, and of releasing the mold.

FIG. 15 is a sectional view showing a relationship among a conventional mold M, a mold chuck 11, and a mold chuck stage 12. The mold M has a relief pattern P on its surface, and is fixed onto the mold chuck 11 by a mechanical member (not shown). 11P denote plural positioning pins for restricting a position of the mold M on the mold chuck 11 in installing the mold M on the mold chuck 11. The mold chuck 11 is also placed on the mold chuck stage 12 by another mechanical member (not shown). The mold chuck 11 has an opening 11H and the mold chuck stage 12 has an opening 12H, and these openings 11H and 12H allow the UV light emitted from a light source (not shown) to pass through the mold M. Plural load sensors (not shown) as force detectors are attached to the mold chuck 11 or the mold chuck stage 12.

The mold M is pressed against the resist (not shown) via the mold chuck stage 12 and the mold chuck 11. During pressing, in accordance with the output of the load sensor, the mold chuck stage 12 controls an inclination of the mold chuck 11 and a servomotor (not shown) controls a compression state of the mold M. Thereafter, the UV light is irradiated onto the mold M via the openings 11H and 12H.

One proposed method assists release by utilizing the ultrasonic vibration in a pattern's depth direction during release. See, SCIVAX Corporation, 03. Imprint Technology, Sep. 7, 2005.

Other prior art include Japanese Patent Applications, Publication Nos. 2004-288811 and 2003-7597, and Japanese Patent No. 3,450,631.

FIG. 16 is a sectional view showing a compression state of the mold M having the transfer pattern P against a resist R on a wafer W. A principal releasing force after photo-curing is a force for releasing a perpendicular surface PW of the transfer patter P from a resist contact surface in parallel rather than a force for perpendicularly releasing horizontal planes of a concave PB, a convex PT, and a horizontal part PS of the transfer pattern P from the resist contact surfaces. One typical method of reducing the releasing force is a method of applying the release agent to the mold, but the durability of the release agent weakens as the release times increases, and the force necessary for the release disadvantageously increases as the release times increases.

SCIVAX Corporation, 03. Imprint Technology, Sep. 7, 2005, teaches to apply the ultrasonic vibration to the mold during release, but is silent about a detailed pressure relationship between the mold and the resist in applying the vibration. Japanese Patent Application, Publication No. 2004-288811 teaches to apply the ultrasonic vibration to the mold during transferring so as to lower the molten resin viscosity through the ultrasonic vibration, to reduce the compression force, and to shorten the transfer time, rather than facilitating the release. See, for example, Japanese Patent Application, Publication No. 2004-288811, paragraph nos. 0006 and 0007. After all, the release of the mold requires experience and skill, a long time period and/or a large force. A long release time period lowers the throughput of the processing apparatus, and a large release force needs a bulk releasing force generator, causing a large size of the entire apparatus or an increased cost.

BRIEF SUMMARY OF THE INVENTION

The present invention is directed to a processing apparatus and method that contributes to an improvement of the throughput and a miniaturization of the apparatus.

A processing method according to one aspect of the present invention for transferring a relief pattern of a mold to a resist includes the steps of compressing the mold having the relief pattern against the resist on a substrate, irradiating an exposure light onto the resist through the mold, vibrating the mold and the substrate relative to each other during the irradiating step, and releasing the mold from the resist.

A processing apparatus according to another aspect of the present invention for compressing a mold having a relief pattern against a resist on a substrate, and for irradiating an exposure light onto the resist through the mold, thereby transferring the relief pattern to the resist includes a magnification corrector for changing a magnification of the pattern by an external force applied to the mold, and a controller for controlling the magnification so as to vibrate the mold when determining that a compression state between the mold and the resist is a predetermined state or when a dose of the light is a predetermined amount.

A device manufacturing method according to another aspect of the present invention includes the steps of transferring a pattern onto a resist of a substrate using the above processing apparatus, and etching the substrate. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and features of the present invention will become readily apparent from the following description of the preferred embodiments with reference to accompanying drawings.

DETAILED DESCRIPTION OF THE PREFERRED EMBODIMENTS

Figure 1:
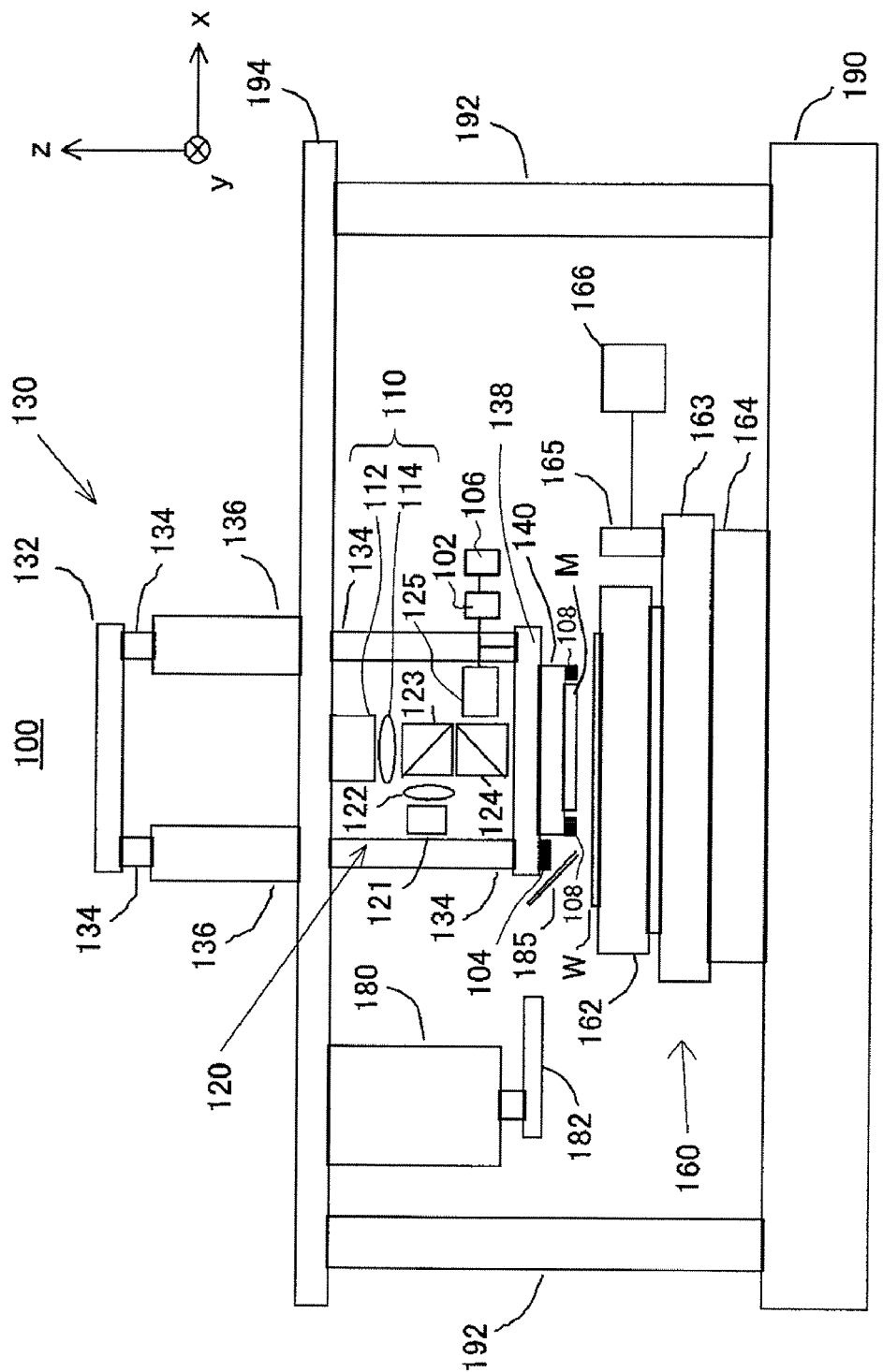
FIG. 1 is a schematic sectional view of a processing apparatus or a nanoimprint apparatus according to a first embodiment of the present invention.

Referring now to the accompanying drawings, a description will be given of a nanoimprint apparatus or processing apparatus 100 that uses a photo-curing method according to one aspect of the present invention. Here, FIG. 1 is a schematic sectional view of the nanoimprint apparatus 100.

The nanoimprint apparatus 100 includes a compression adjuster, an interval measuring part, a light-quantity measuring part, a light irradiator 110, a mold M, an interferometer 120, a mold driver 130, a vibrator mechanism, a wafer (substrate) W, a wafer driver 160, a mold feeder, a resist supplier, and another mechanism.

The compression adjuster includes a controller 102, a load sensor 104, and a memory 106. The controller 102 is attached to a body (not shown) of the apparatus 100. The load sensor 104 is attached to the mold chuck stage 138 or mold chuck 140, which will be described later. The memory 106 stores a value of a predetermined compression force. The controller 102 determines whether the compression force from the mold M to the wafer W, detected by the load sensor 104, is the predetermined value stored in the memory 106. The controller 102 serves not only as a controller of the compression adjuster, but also as a controller of each component in the apparatus 100, as described later.

The interval measuring part includes the controller 102, the memory 106, and a distance-measuring part 107. The memory 106 stores a value of a predetermined interval. The distance-measuring part 107 measures a distance between the mold M and the wafer W. The distance-measuring part 107 is provided to a mold chuck body 142 in FIG. 1, but may be provided to a wafer chuck 162. The controller 102 determines whether the distance between the mold M and the wafer W, detected by the distance-measuring part 107, is the predetermined value stored in the memory 106.

The light-quantity measuring part includes the controller 102, the memory 106, and a light quantity sensor 108. The memory 106 stores a value of a predetermined light intensity. The light quantity sensor 108 measure the light intensity irradiated onto the wafer W. The light quantity sensor 108 is provided to the mold chuck body 142 in FIG. 1, but may be provided to the wafer chuck 162. The controller 102 determines whether the light intensity between the mold M and the wafer W, detected by the light quantity sensor 108, is the predetermined value stored in the memory 106.

The light irradiating part 110 irradiates, through the mold M, the UV light and for curing a photo-curing resin or the resist (not shown) applied onto the wafer W, and includes alight source part 112, and an illumination optical system 114. The light source part 112 is controlled by the controller 102, and includes a halogen lamp that generates the UV light, such as i-line and g-line, etc. The illumination optical system 114 includes a lens and an aperture, and shapes the illumination light used to expose and cure the resist. The illumination optical system 114 is shown as, but not limited to, a collimator lens (and beam splitters 123 and 124) in FIG. 1. For example, the illumination optical system may include an optical integrator to uniformly illuminate the mold M, if necessary.

The mold M has a pattern P to be transferred to the wafer W, and is made of a transparent material to transmit the UV light so as to cure the resist.

The mold driver 130 includes an imprint mechanism that serves as a driver used to press the mold M in the lower direction and to release the mold M in the upper direction in FIG. 1, and the mold chuck 140 that holds the mold M on the apparatus 100.

The imprint mechanism provides, in addition to a longitudinal movement, an orientation changing mechanism and controls the orientation and alignment in the rotational direction for an adhesion between the mold transfer surface and the wafer W. The imprint mechanism includes a guide plate 132, a pair of guide bars 134, a pair of linear actuators 136, and a mold chuck stage 138. One end of each guide bar 134 is fixed onto the guide plate 132 and perforates the top plate 194. The other end of each guide bar 134 is fixed onto the mold chuck stage 138. The linear actuator 136 is controlled by the controller 102, and includes an air cylinder or linear motor. The linear actuator 136 drives the guide bar 134 in the z direction in FIG. 1. The mold chuck stage 138 has a correction function of a position in the θ direction (or a rotating direction around the z-axis), and a tilt function to correct an inclination of the mold M. The mold chuck stage 138 has a perforation hole or opening 139, and the mold chuck 140 has perforation holes or openings 143 and 145. The lights from the light source parts 112 and 121 pass through these openings 139, 143 and 145.

Figure 2:
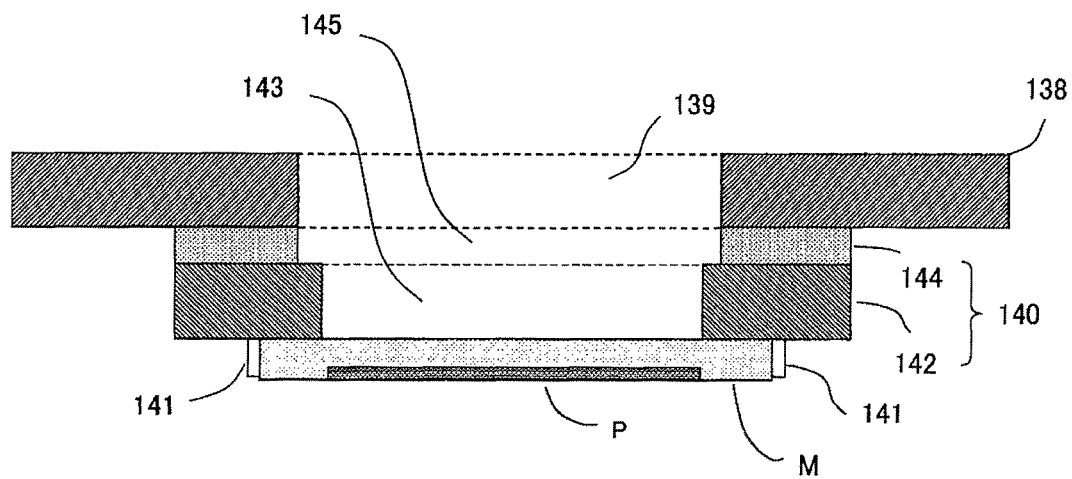
FIG. 2 is a schematic sectional view around a mold chuck of the processing apparatus shown in FIG. 1.

FIG. 2 shows a sectional view around the mold chuck 140, which includes positioning pins 141 and a body 142. This embodiment provides a piezoelectric element 144 as a vibrator mechanism to the mold chuck 140.

The mold M is fixed onto the mold chuck body 142 via plural positioning pins 141. These positioning pins 141 restrict a position of the mold M on the body 142 in attaching the mold onto the body 142.

The vibrator mechanism vibrates the mold M and the resist R of the wafer W relative to each other, i.e., at least one of them relative to the other, and facilitates a subsequent release between the mold M and the wafer W. The vibration applied by the vibrator mechanism may be a steady vibration or an impact. Preferably, the applied vibration has a frequency and amplitude set in accordance with the shape of the pattern P and the characteristic of the resist R. For example, the amplitude is made smaller and/or the oscillation frequency is made higher for a resist having a low viscosity and a high curing speed (or a high UV sensitivity) or a relief pattern having a small pitch. The vibrator mechanism preferably changes the oscillation frequency and/or amplitude during vibrations, or applies two or more types of vibrations having different frequencies and/or amplitudes. This is because the suitable releasing vibration depends upon a frequency and amplitude due to the pattern P's density. An arbitrary timing after the irradiation of the UV light starts and before the irradiation of the UV light ends may be used to apply a relative steady vibration to the mold and wafer. Preferably, the steady vibration is applied not just after the UV irradiation starts, but after 30% or more preferably 50% of the overall irradiation time period elapses.

The timing of applying the vibration is important. After the vibration starts after the transfer ends, as disclosed in SCIVAX Corporation, 03. Imprint technology, the adhesion between the mold and the resist becomes strong and the releasing force is likely to increase. On the other hand, Japanese Patent Application, Publication No. 2004-288811 lowers the molten viscosity by applying the ultrasonic vibration to the resin for the reduced compression force and the shortened transfer time period, rather than easy releasing. For the reduced compression force, the ultrasonic vibration is applied before the compression but this would strengthen the adhesion between the mold and the resist in releasing, and the releasing force is likely to increase. Accordingly, some embodiments of the present invention apply the vibration while the light for exposing the resist R is irradiated onto the resist R. The vibration starts, for example, based on the compression state between the mold M and the resist R and whether the exposure light dose reaches the predetermined amount.

The piezoelectric element 144 of this embodiment forms one illustrative vibrator mechanism for vibrating the mold M, is integrated with the mold chuck body 142 between the mold chuck body 142 and the mold chuck stage 138, and vibrates the mold M. The piezoelectric element 144 has the opening 145 at the center, and vibrates in the thickness direction or the longitudinal direction of the paper plane. As described later with reference to FIG. 6, the vibrator mechanism is not limited to the piezoelectric element 144.

The interferometer 120 detects the compression state of the mold N against the wafer W, and includes the illumination light source 121, a collimator lens 122, beam splitters 123 and 124, and an imaging system 125, the controller 102, and the memory 106. The illumination light source 121 projects the light having a different wavelength from that of the light source part 112, and can also project a monochromatic light when switched. The collimator lens 122 converts the incident light into the parallel light. The beam splitter 123 is arranged in the optical path of the light source part 121, and deflects the projected light from the illumination light source 121 to the mold M. The beam splitter 124 is similarly arranged in the optical path of the light source part 121, and deflects the reflected light from the mold M to the imaging system 125. The imaging system 125 has, for example, a CCD. The memory 106 stores information used to recognize the compression state, and the controller 102 determines whether the compression state observed by the interferometer 120 satisfies the predetermined state stored in the memory 106.

The wafer W is a plate to which the pattern of the mold M is transferred, and a semiconductor IC circuit is formed through the subsequent processes, and similar to that used in the conventional semiconductor process.

The wafer driver 160 includes a wafer chuck 162, a fine-adjustment stage 163, an XY stage 164, a reference mirror 165, and a laser interferometer 166. The wafer chuck 162 holds the wafer W. The fine-adjustment stage 163 is controlled by the controller 102, and has a correction function of a position of the θ direction (or the rotating direction around the z-axis), an adjustment function of a z position of the wafer W, and a tilt function to correct an inclination of the wafer W. The XY stage 164 is controlled by the controller 102, and is provided so as to position the wafer W in place. The entire surface of the wafer W is transferable by the wafer driver 160, and an overlay among fine patterns is available due to the highly precise positioning and the orientation adjusting mechanism of the surface of the wafer W. The reference mirror 165 is attached to the fine-adjustment stage 163 in the x and y directions (although the y direction is not shown), and reflects the light from the laser interferometer 166. The reference mirror 165 and the laser interferometer 166 serve to measure a position of the fine-adjustment stage 163. The laser interferometer 166 is controlled by the controller 102.

The mold feeder includes the mold feeding robot 180. The robot 180 holds and feeds the mold M using a hand 182 through a vacuum absorption.

The resist supplier includes a tank (not shown) for storing the resist before UV irradiation or curing, a nozzle 185 that is connected to the tank and drops the resist onto the wafer W's surface, and a valve (not shown) that switches between dropping and stopping of the resist from the nozzle 185. It is preferable to control the resist supply amount. For example, in the supply amount control, the opposing area between the mold M and the wafer W is calculated from the coordinate position of the XY stage 164, and the volume is calculated as a necessary supply amount by multiplying the area by the interval between the average height of the relief of the mold M and the wafer W. This configuration prevents an unnecessary resist from spilling from the wafer W, and from contaminating the wafer chuck 162 and the XY stage 164.

The other mechanism includes a stool 190 on which the XY stage is placed, plural posts 192 that stand on the stool 190, and a top plate 194 supported on these posts 192. The stool 190 supports the entire apparatus 100, and forms a reference plane of the movement of the wafer stage 164. The stool 190 is placed on a floor via a damper (not shown). The posts 192 support the components including the light irradiating part 110 to the mold M above the wafer W.

Figure 3:
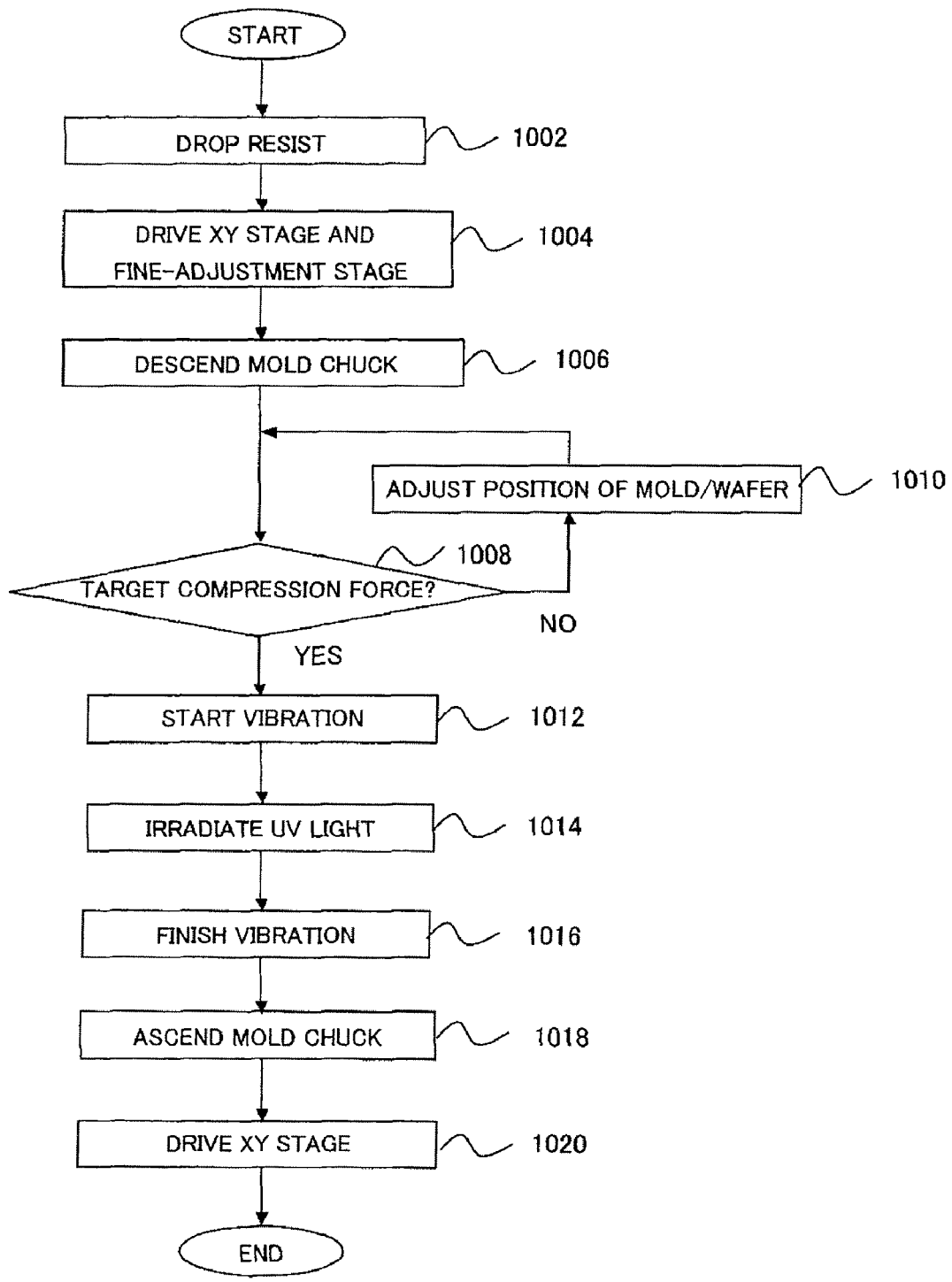
FIG. 3 is a flowchart for explaining an operation of the processing apparatus shown in FIG. 1.

Referring now to FIG. 3, a description will be given of the processing method of the first embodiment that utilizes the nanoimprint apparatus 100. Here, FIG. 3 is a flowchart for explaining an operation of the nanoimprint apparatus 100 of this embodiment.

In operation, the wafer W to be transferred is placed on the wafer chuck 162 by the wafer feeding system (not shown). The wafer chuck 162 vacuum-absorbs and holds the wafer W. The XY stage 164 is initially driven to move the wafer chuck 162 mounted with the wafer W, and to position it under the nozzle 185 at a location or shot on the wafer W on which the pattern is transferred.

Next, the nozzle 185 drops a proper amount of resist (photo-curing resin) on a target shot of the wafer W (step 1002). Next, the wafer W is positioned (step 1004). More specifically, after the XY stage 164 is driven so that the shot plane is located opposite to the pattern P of the mold M, the fine-adjustment stage 163 is driven so that a height and inclination in the Z direction of the wafer chuck 162. The shot surface of the wafer W is aligned with the reference plane (not shown) of the apparatus 100.

Next, the imprint mechanism drives the linear actuator 136 and descends the mold chuck 140 and the mold M to the predetermined position, compressing the mold M against the resist (step 1006). The controller 102 determines based on the output of the load sensor 104 whether the compression force is within a predetermined range (step 1008).

The controller 102 when determining that the compression force is not within the predetermined range (step 1008) directs the mold chuck stage 138 to change the position and inclination in the z direction of the mold chuck 140 or the fine-adjustment stage 163 to change the position and inclination in the z direction of the wafer chuck 162, adjusting the compression force of the mold M (step 1010). Steps 1008 and 1010 are repeated until the predetermined compression force is obtained.

On the other hand, the controller 102 when determining that the compression force of the mold M is proper (step 1008) starts the vibration of the piezoelectric element 144 in the thickness direction to minutely vibrate the mold M in the compression direction or the z direction in FIG. 1 (step 1012). Subsequently, the light source part 112 irradiates the UV light for a predetermined time period (step 1014). In that case, the frequency and amplitude of the fine vibration are changed in accordance with the resist characteristic and the pattern shape, as described above. When the UV irradiation ends, the piezoelectric element 144 stops vibrating (step 1016).

Next, the controller 102 drives the linear actuator 136 to ascend the mold chuck 140 and release the mold M from the resist on the wafer W (step 1018). Lastly, the controller 102 drives the XY stage 164 (step 1020) to move the wafer W so that the next shot is under the nozzle 185. This procedure is repeated for sequential transfers (step and repeat). When all transfers end, the wafer W is fed out and the next wafer W is fed in.

The resist cures with the low degree of coupling between the mold pattern's perpendicular plane and the resist by the fine adjustment of the mold in the compression direction during the UV irradiation. As a result, the release time period can be made shorter by reducing the force necessary to release the mold.

Figure 4:
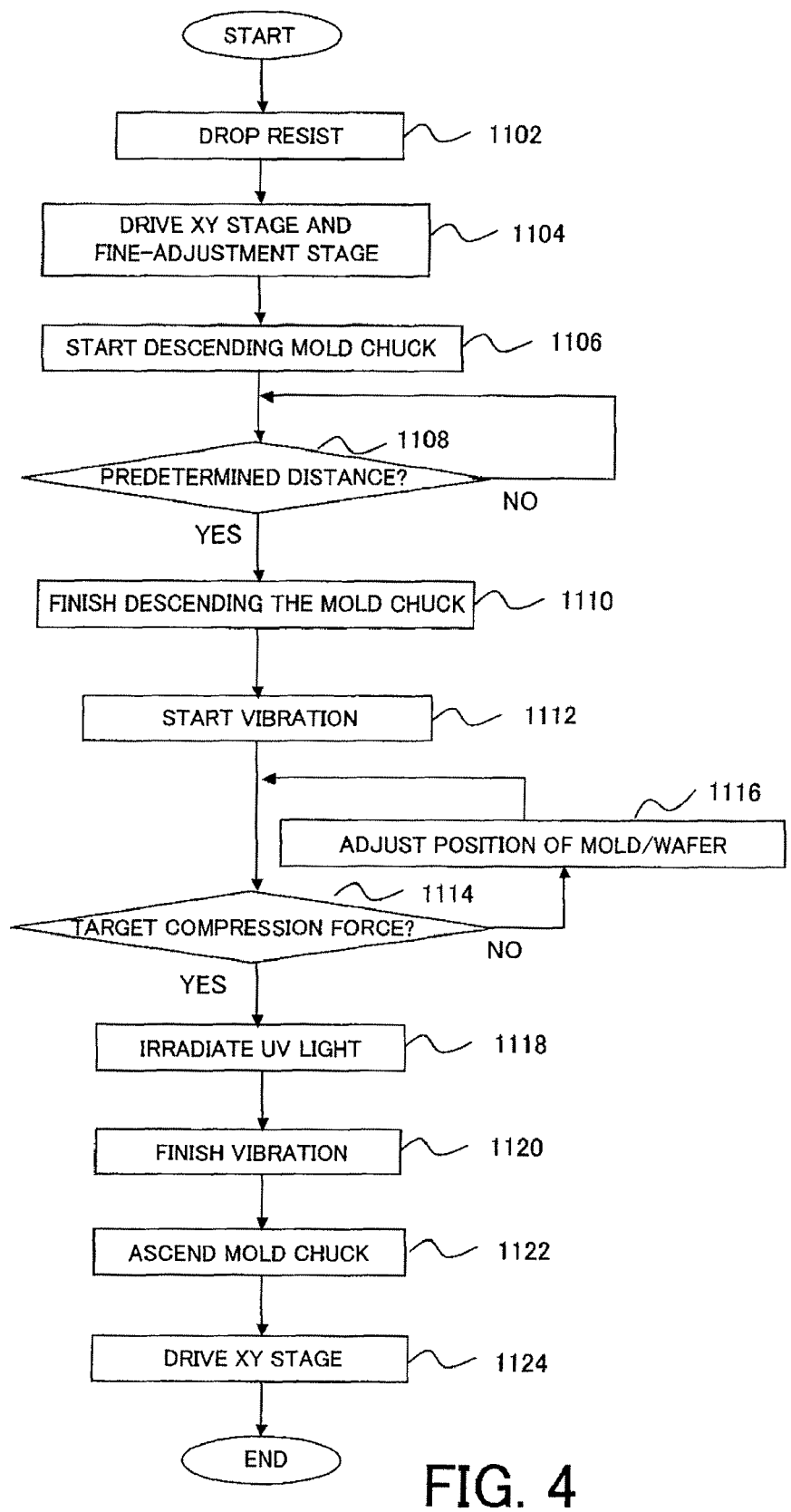
FIG. 4 is a flowchart for explaining another operation of the processing apparatus shown in FIG. 1.

Referring now to FIG. 4, a description will be given of the processing method of the second embodiment utilizing the nanoimprint apparatus 100. Here, FIG. 4 is a flowchart for explaining an operation of the nanoimprint apparatus 100 of this embodiment. This embodiment is different from the first embodiment in that the mold starts vibrating before the compression of the mold against the resist ends.

Steps 1102 to 1104 are similar to steps 1002 to 1004. Next, the imprint mechanism drives the linear actuator 136 and starts descending the mold chuck 140 and the mold M down to the predetermined position (step 1106). The controller 102 determines whether the distance between the mold M and the wafer W is the predetermined value stored in the memory 106 (step 1108), and allows the descent down to the predetermined value. As a result, the controller 102 confirms that the mold chuck 140 descends down to the predetermined position. The controller 102 when determining that the distance between the mold M and the wafer W is a predetermined value (step 1108) instructs the imprint mechanism to stop descending the mold chuck 140 (step 1110).

Next, the controller 102 instructs the piezoelectric element 144 to start vibrating in the thickness direction, and minutely vibrates the mold M in the compression direction or the z direction in FIG. 1 (step 1112). The controller 102 determines based on the output of the load sensor 104 whether the compression force is within the predetermined range (step 1114).

When the controller 102 determines that the compression force is not within the predetermined range (step 1114), the controller 102 instructs the mold chuck stage 138 to change the position and the inclination in the z direction of the mold chuck 140 or the fine-adjustment stage 163 to change the position and inclination in the z direction of the wafer chuck 162, adjusting the compression force of the mold M (step 1116). The steps 1114 and 1116 repeat until the predetermined compression force is acquired.

The controller 102 when determining that the compression force is within a predetermined range (step 1114) irradiates the UV light for the predetermined time period through the light source part 112 (step 1118). In that case, the frequency and amplitude of the fine vibration change in accordance with the resist characteristic and the pattern shape. For example, the amplitude is made smaller and/or the oscillation frequency is made higher for a resist having a low viscosity and a high curing speed (or a high UV sensitivity) or a relief pattern having a small pitch. When the UV irradiation ends, the piezoelectric element 144 stops vibrating (step 1120).

Next, the controller 102 drives the linear actuator 136, ascends the mold chuck 140, and detaches the mold M from the resist of the wafer W (step 1122). Lastly, the controller 102 drives the XY stage 164 (step 1124), and moves the wafer W so that the next shot is located under the nozzle 185. This procedure is repeated for sequential transfers (step and repeat). When all transfers end, the wafer W is fed out and the next wafer W is fed in.

Thus, this embodiment has the same effect as the first embodiment when the mold is minutely vibrated before the compression of the mold ends and before the UV irradiation starts. In addition, the fine vibration has an effect of preventing the air mixture and residue in the concave in the mold pattern when the mold is compressed.

Figure 5:
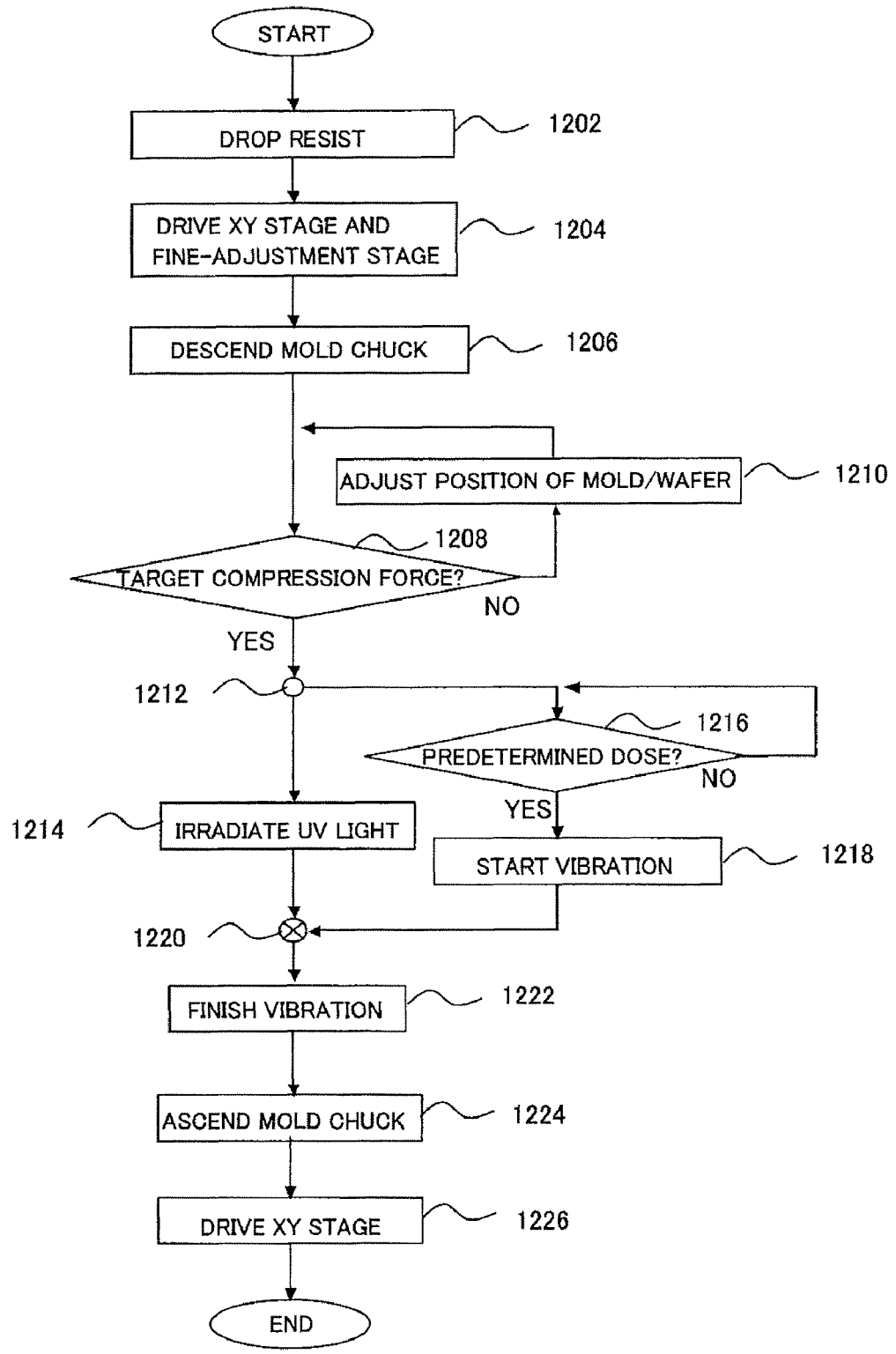
FIG. 5 is a flowchart for explaining still another operation of the processing apparatus shown in FIG. 1.

Referring now to FIG. 5, a description will be given of the processing method of the third embodiment utilizing the nanoimprint apparatus 100. Here, FIG. 5 is a flowchart for explaining an operation of the nanoimprint apparatus 100 of this embodiment. This embodiment is different from the first embodiment in that the fine vibration of the mold starts after a predetermined dose of the UV light is irradiated.

Steps 1202 to 1210 are similar to steps 1002 to 1010. The controller 102 when determining that the compression force of the mold M is proper (step 1208) divides the procedure into two (step 1212). Step 1214 irradiates the UV light for the predetermined time period through the light source part 112. In parallel, the controller 102 measures the strength of the UV light through the light quantity sensor 108, and determines whether the predetermined dose is illuminated from a product between the light intensity and the irradiation time period (step 1216). The predetermined dose is within a range between 0 and a dose necessary to completely cure the resist, and the processing apparatus's user properly sets in accordance with the resist characteristic and the pattern shape. The controller 102 continues the irradiation when the irradiation dose is not the predetermined dose (step 1216). On the other hand, the controller 102 when determining that the irradiation dose is the predetermined dose (step 1216) starts the vibration and minutely vibrates the mold M in the compression direction or z direction in FIG. 1 (step 1218). The vibration may start simultaneous with the start of the UV irradiation or during the UV irradiation, or after the UV irradiation ends. In that case, the frequency and amplitude of the fine vibration change in accordance with the resist characteristic and the pattern shape. For example, the amplitude is made smaller and/or the oscillation frequency is made higher for a resist having a low viscosity and a high curing speed (or a high UV sensitivity) or a relief pattern having a small pitch. When the UV irradiation ends, the piezoelectric element 144 stops vibrating (step 1222).

Next, the controller 102 drives the linear actuator 136 to ascend the mold chuck 140 and release the mold M from the resist on the wafer W (step 1224). Lastly, the controller 102 drives the XY stage 164 (step 1226), and the wafer W is moved so that the next shot is located under the nozzle 185. This procedure is repeated for sequential transfers (step and repeat). When all transfers end, the wafer W is fed out and the next wafer W is fed in.

Thus, when the timing at which the fine vibration of the mold starts is adjusted in accordance with the resist characteristic and the pattern shape, an interface between the resist and mold pattern's perpendicular surface can be prevented from coupling and can be more effectively separated. As a result, the force necessary to release the mold can be reduced, and the release time period can be shortened.

Figure 6:
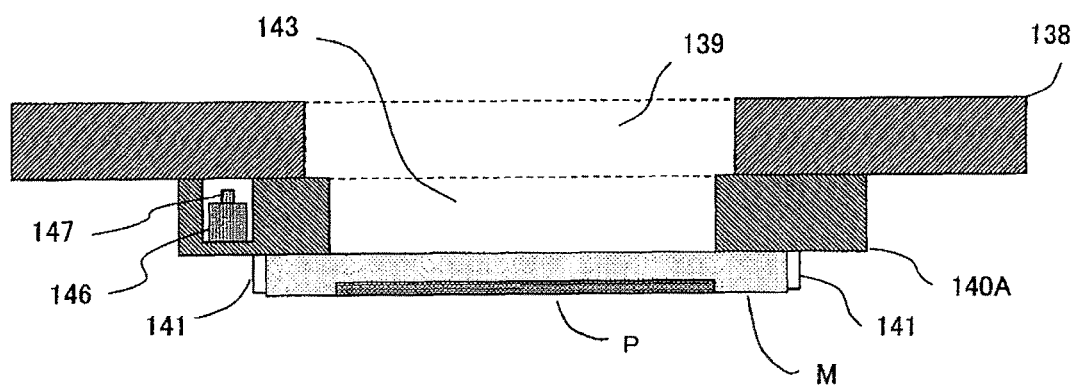
FIG. 6 is a schematic sectional view around the mold chuck as a variation of a vibrator mechanism shown in FIG. 2.

FIG. 6 is a sectional view around the mold chuck showing a variation of the vibration mechanism shown in FIG. 2. This embodiment uses an actuator 146 for the vibration mechanism instead of the piezoelectric element 144. Those elements in FIG. 6 which are the corresponding elements in FIG. 2 are designated by the same reference numerals, and a description thereof will be omitted. A mold chuck 140A houses the actuator 146 instead of the piezoelectric element 144. The actuator 146 has a movable pin 147, which projects and collides with the mold chuck stage 138. The actuator 146 includes an air cylinder and a voice coil motor. The number of actuators 146 is not limited.

Figure 8:
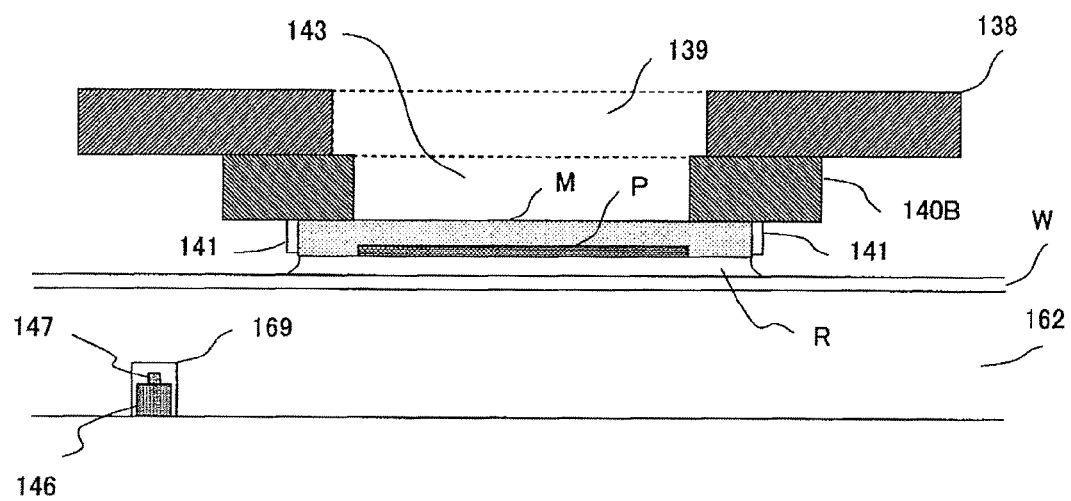
FIG. 8 is a schematic sectional view around the mold chuck as another variation of the vibrator mechanism shown in FIG. 2.

A closed space for accommodating the actuator 146 is formed inside the mold chuck 140A, and the movable pin 147 may collide with the ceiling of the closed space instead of the mold chuck stage 138. The actuator 146 may be located in a closed space 169 in the wafer chuck 162 instead of the mold chuck 140B as shown in FIG. 8, and the movable pin 147 may collide with the ceiling of the closed space 169. Moreover, the fine-adjustment stage 163 may have the actuator instead of the mold chuck 140A and the wafer chuck 162. When the fine-adjustment stage 163 is quickly moved in the z direction by a small amount, an impact can be applied to the mold M.

Figure 7:
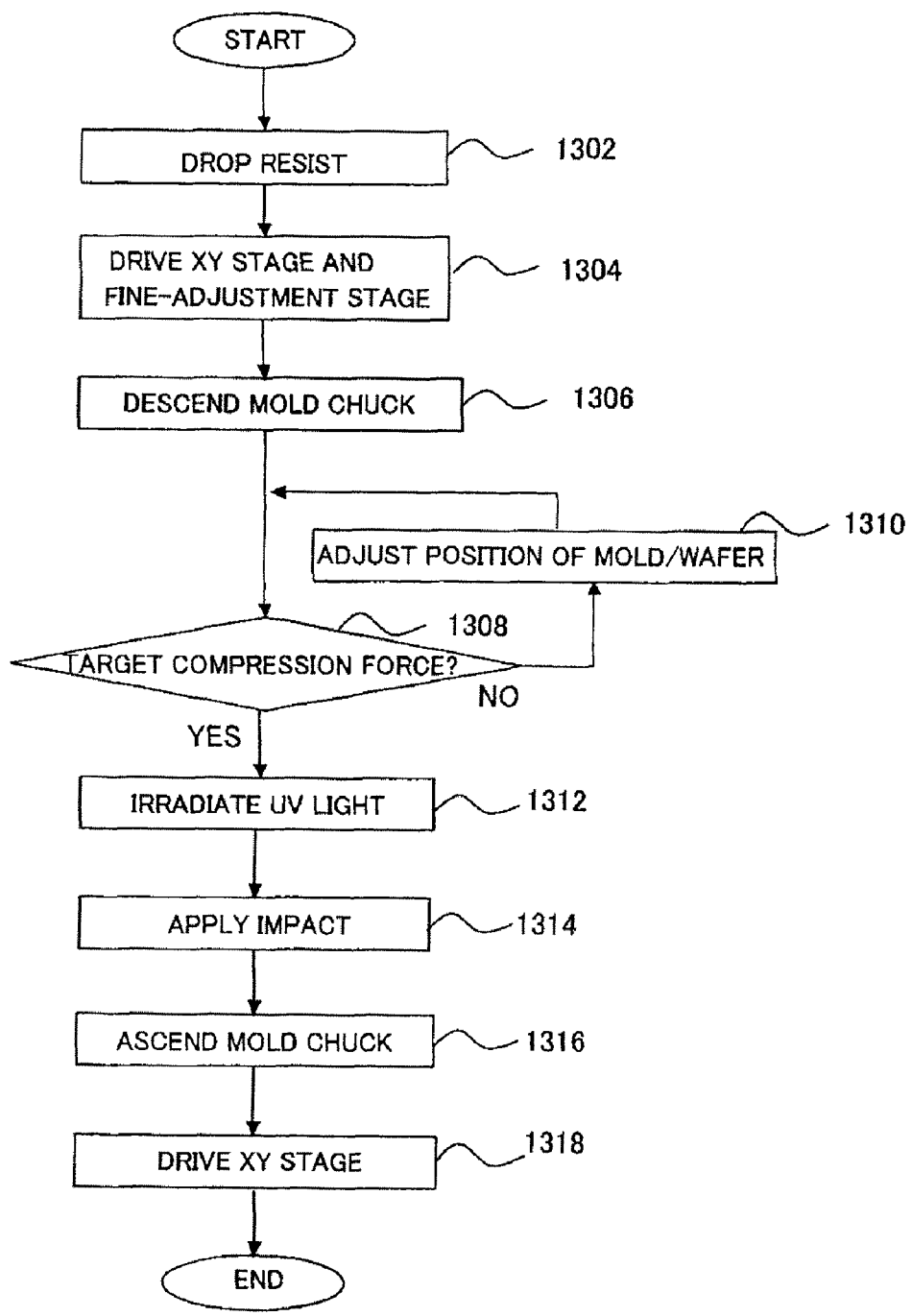
FIG. 7 is a flowchart for explaining an operation of the processing apparatus having the vibrator mechanism shown in FIG. 6.

FIG. 7 is a flowchart common to operations of the nanoimprint apparatuses having the vibrator mechanisms shown in FIGS. 6 and 8. In FIG. 7, the flow up to step 1310 is similar to the flow up to step 1010 shown in FIG. 3, and step 1312 is similar to step 1014. Next, the actuator 146 housed in the mold chuck 140A is activated, and the movable pin 147 hits the rear surface of the mold chuck 140A or the ceiling of the closed space 169 (step 1314). The reaction at this time is transmitted as an impact to the mold M. The release starting point is formed between the cured resist R and the mold M. Steps 1316 and 1318 are similar to steps 1018 and 1020. Plural combinations of the actuator 146 and the movable pin 147 may be prepared so as to form plural release starting points.

Thus, the release starting point can be formed by applying the impact to the mold before the mold is released but after the UV light is irradiated, and a smaller force can release the mold from that starting point. The configuration shown in FIG. 8 does not require the actuator 146 for each shot because an impact may be consequently transmitted to the mold.

Figure 9:
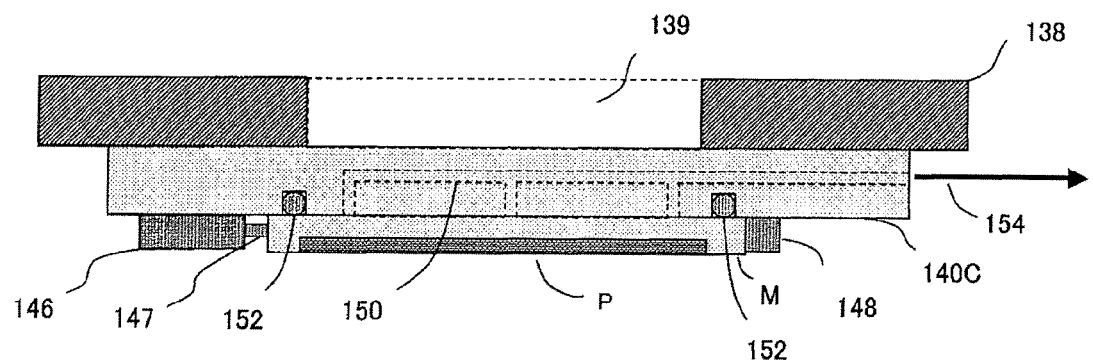
FIG. 9 is a schematic sectional view around the mold chuck as still another variation of the vibrator mechanism shown in FIG. 2.
Figures 10A, 10B:
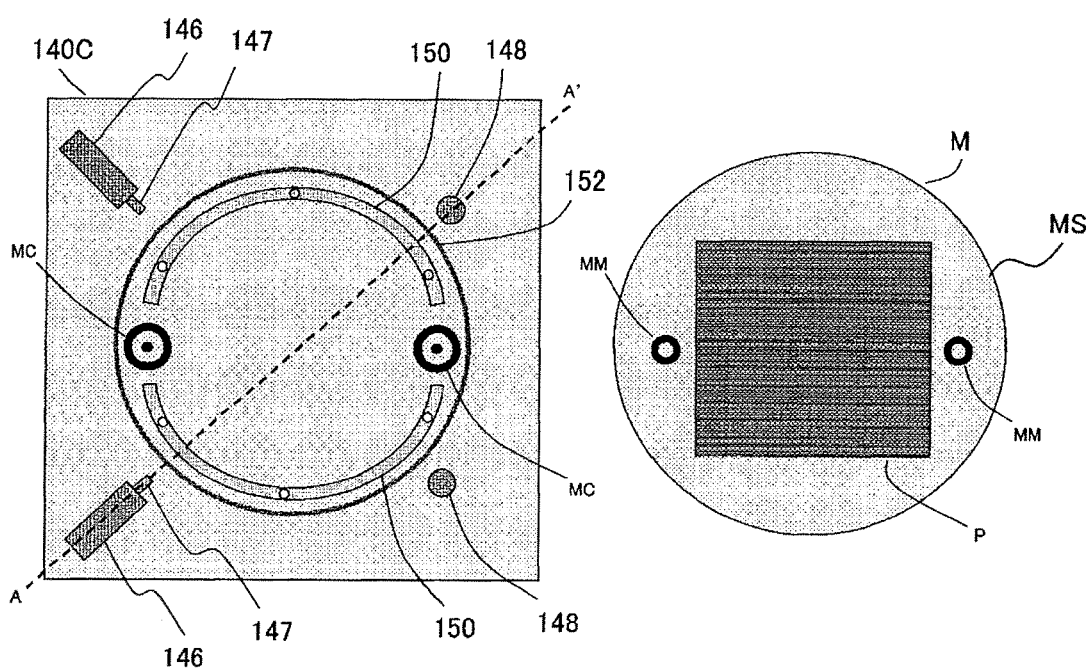
FIG. 10A is a schematic plane view of the mold chuck shown in FIG. 9.
FIG. 10B is a schematic plane view of the mold.

FIG. 9 is a sectional view around the mold chuck 140C showing a variation of the arrangement of the vibrator mechanisms shown in FIGS. 6 and 8. FIG. 10A is a schematic plane view of the mold chuck 140C. FIG. 10B is a schematic plane view of the mold M. The section shown in an A-A' broken line in FIG. 10A corresponds to FIG. 9. In FIG. 9, the mold chuck 140C that is fixed onto the mold chuck stage 138 by a mechanical holder is transparent to the UV light from the light source part 112, such as quartz.

The mold chuck 140C of this embodiment has an exhaust passage 150, an O-ring 152, and a pair of alignment marks MC instead of the positioning pins 141, and two pairs of the actuator 146 and the fixing pin 148 are fixed on the bottom surface.

The exhaust passage 150 is connected to a vacuum pipe 154, and the vacuum pipe 154 is connected to a vacuum pump (not shown). As a result, the mold M is vacuum-absorbed by the mold chuck 140C. The O-ring 152 has an annular shape that encloses the vicinity of the mold M, as shown in FIGS. 9 and 10A, and maintains the degree of vacuum between the mold M and the mold chuck 140C.

A pair of alignment marks MC are located in place inside the O-ring 152 where the irradiated UV light does not pass, and the mold M also has a pair of alignment marks MM in place corresponding to the alignment marks MC outside the pattern P. The alignment marks MC and MM are used for an alignment on the xy plane when the mold feeding robot 180 attaches the mold M to the mold chuck 140C. The alignment mark is effective when it is difficult to provide a positioning pin etc. to the optically transparent mold chuck. Since no positioning pins 141 are necessary, no accidental cracks of the mold M occur due to a collision between the mold M and the positioning pin in installing the mold. The alignment mark may be applied to the above embodiments.

The actuator 146 is fixed on the bottom surface of the mold chuck 140C so that the moving direction of the movable pin 147 is approximately perpendicular to that in FIGS. 6 and 8. The movable pin 147 may hit a side surface MS of the mold M. The fixing pin 148 stands vertically to the bottom surface, and is arranged in an extended moving direction of the movable pin 147 through the mold M. As shown in FIG. 10A, two pairs of the actuators 146 and the fixing pins 148 are arranged in the diagonal direction of the pattern P, and used for the magnification correction of the pattern P. This assignee discloses, in Japanese Patent Application, Publication No. 2003-7597, the operation at the magnification correction time, and a description thereof will be omitted.

The operational flowchart of the nanoimprint apparatus shown in FIG. 7 is applicable to the structure shown in FIGS. 9 to 10B. The impact direction is approximately perpendicular to that in FIGS. 6 and 8, in which the impact direction is perpendicular to the mold pattern surface. This embodiment has an impact direction parallel to the pattern surface. This embodiment uses the magnification corrector in step 1314 in FIG. 7 in applying the impact to the mold M. More specifically, the movable pin 147 that is pressed against the mold M by the actuator 146 is once retreated to the actuator 146 side and again compressed against the mold M. This configuration forms a release starting point by applying the impact to the pre-released mold M.

Thus, the effects shown in FIGS. 6 to 8 can be obtained by diverting the magnification corrector of the mold pattern P.

Figure 11:
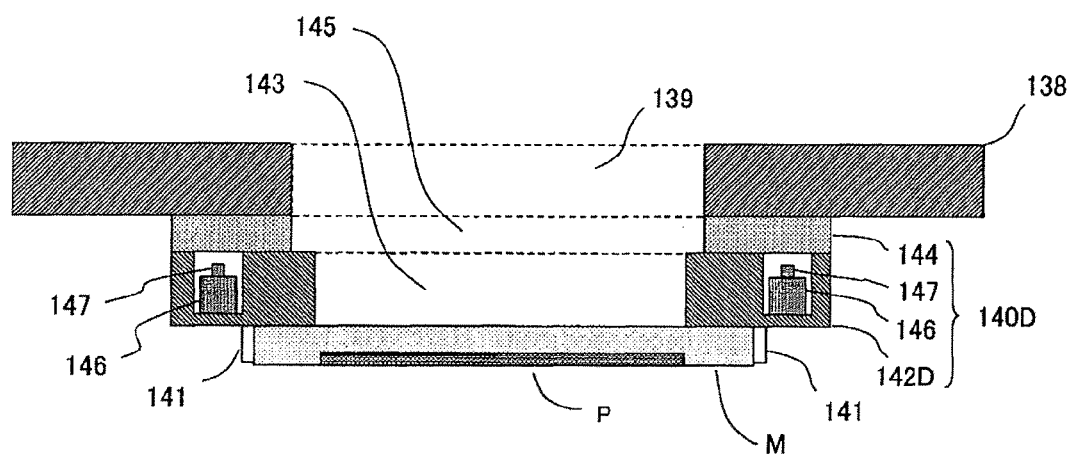
FIG. 11 is a schematic sectional view around the mold chuck showing still another variation of the vibrator mechanism shown in FIG. 2.

FIG. 11 is a schematic sectional view around the mold chuck 140D showing still another variation of the vibrator mechanism shown in FIG. 2. The mold chuck 140D includes both the piezoelectric element 144 and the actuator 146 for the vibrator mechanism. The piezoelectric element 144 is located between the mold chuck 140D and the mold chuck stage 138, and a pair of actuators 146 are arranged in the body 142D. Those elements in FIG. 11 which are the same as corresponding elements in FIGS. 2 and 6 are designated by the same reference numerals, and a detailed description will be omitted.

Figure 12:
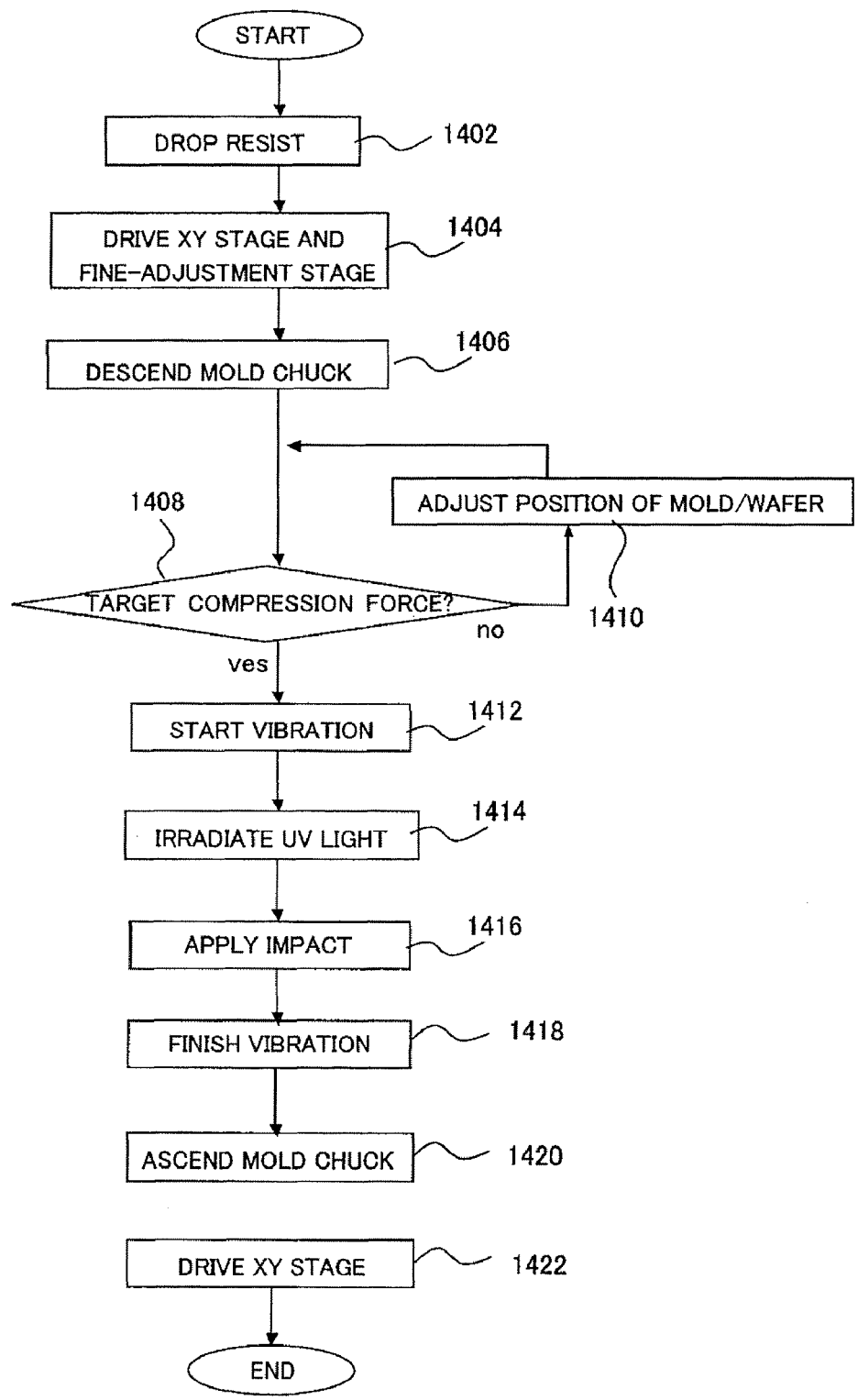
FIG. 12 is a flowchart for explaining an operation of the processing apparatus having the vibrator mechanism shown in FIG. 6.

FIG. 12 is a flowchart of the nanoimprint apparatus having the mold chuck 140D shown in FIG. 11. In FIG. 12, steps 1402 to 1414 and steps 1418 to 1422 are similar to steps 1002 to 1014 and steps 1016 to 1020 in FIG. 3. A difference from FIG. 3 is an addition of step 1416 that applies the impact to the mold M through the actuator 146 before the fine vibration of the piezoelectric element 144 stops and after the UV irradiation (step 1414) for a predetermined time period.

Thus, the mold is minutely vibrated while the resist is curing, and an additional impact is applied to a weak coupling state of an interface between the resist and the mold pattern's perpendicular surface. As a result, a formation of the release starting point becomes easy, and the force necessary to release the mold can significantly reduce.

Figure 13:
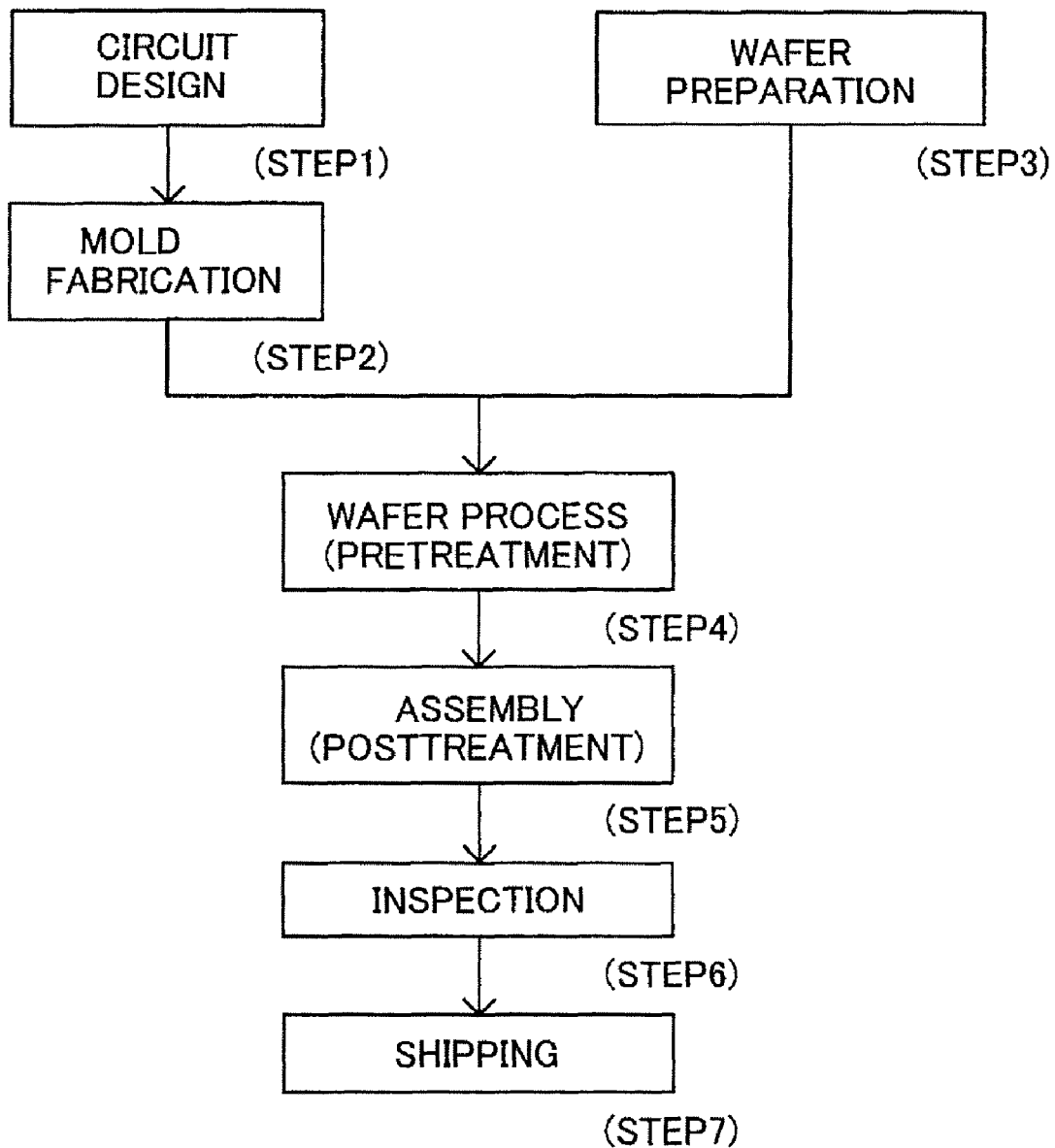
FIG. 13 is a flowchart for explaining a manufacturing method that uses the processing apparatus shown in FIG. 1 to manufacture a device, such as a semiconductor chip, e.g., an IC and an LSI, an LCD, and a CCD.
Figure 14:
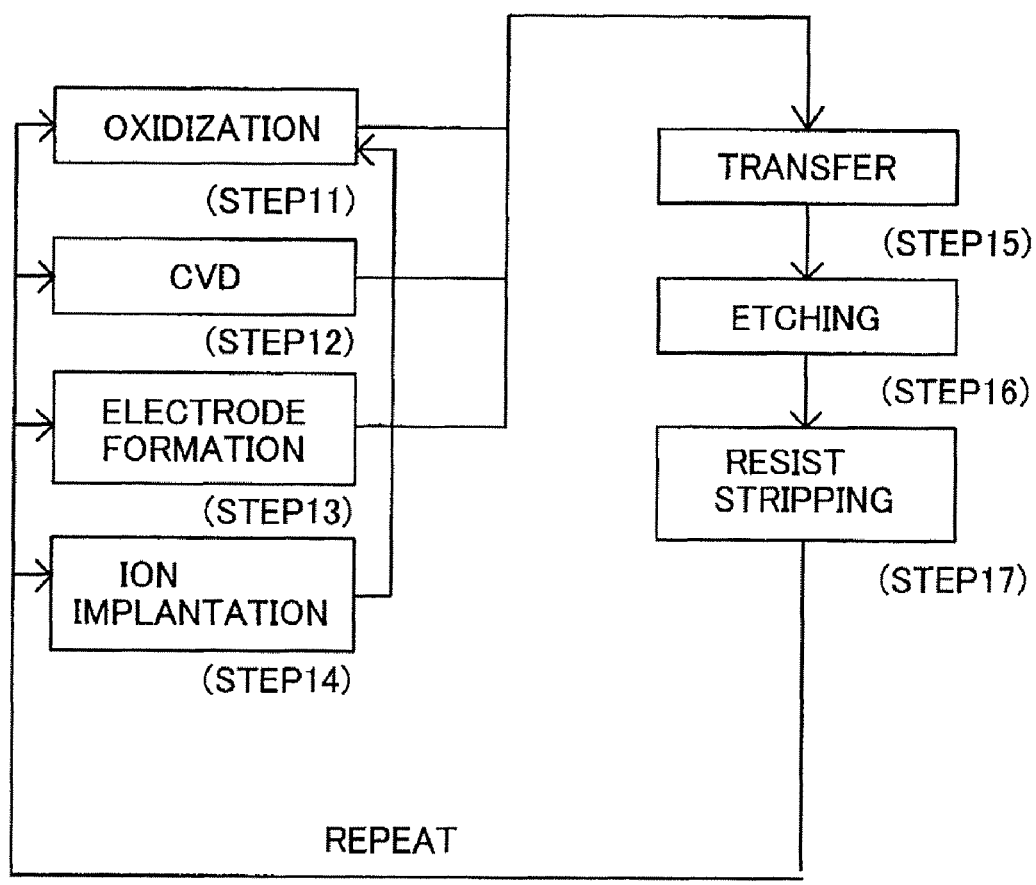
FIG. 14 is a flowchart of a detailed step 4 shown in FIG. 13.
Figure 15:
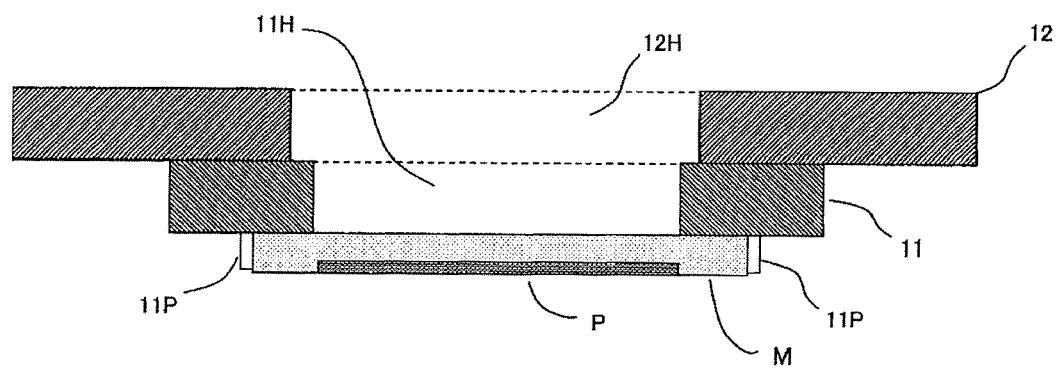
FIG. 15 is a sectional view around the conventional mold chuck.
Figure 16:
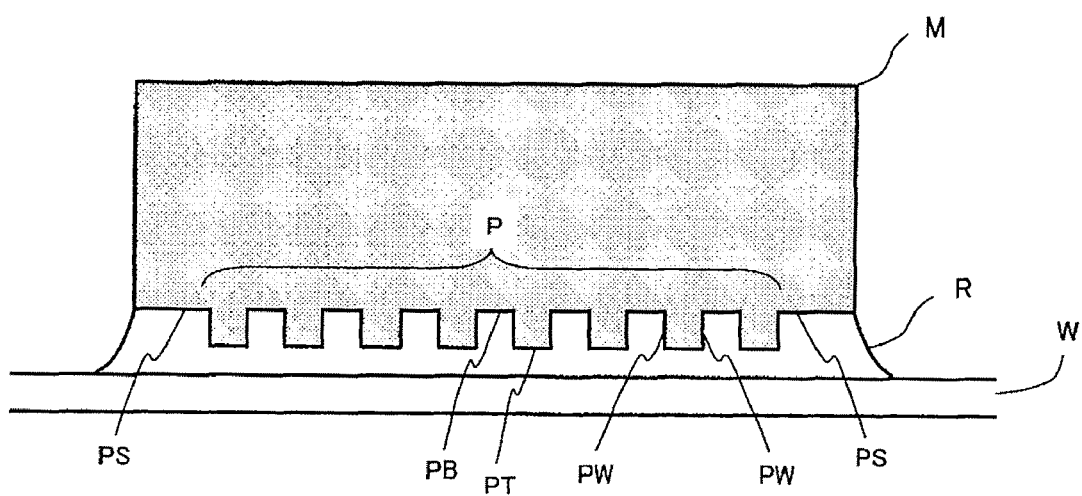
FIG. 16 is a sectional view for explaining a release between the conventional mold and the resist.

Referring now to FIGS. 13 and 14, a description will be given of an embodiment of a device manufacturing method using the above processing apparatus. FIG. 13 is a flowchart for explaining how to fabricate devices (i.e., semiconductor chips such as IC and LSI, LCDs, CCDs, etc.). Here, a description will be given of the manufacture of a semiconductor chip as an example. Step 1 (circuit design) designs a semiconductor device circuit. Step 2 (mold fabrication) forms a mold that forms a pattern corresponding to a designed circuit pattern. Step 3 (wafer preparation) manufactures a wafer using materials such as silicon. Step 4 (wafer process), which is also referred to as a pretreatment, forms actual circuitry on the wafer through the nanoimprint technique using the mold and wafer. Step 5 (assembly), which is also referred to as a post-treatment, forms into a semiconductor chip the wafer formed in Step 4 and includes an assembly step (dicing and bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 14 is a detailed flowchart of the wafer process in Step 4. Step 11 (oxidation) oxidizes the wafer's surface Step 12 (CVD) forms an insulating film on the wafer's surface. Step 13 (electrode formation) forms electrodes on the wafer by vapor disposition and the like. Step 14 (ion implantation) implants ions into the wafer. Step 15 (transfer) presses the mold against the wafer while applying a photosensitive material to the wafer, and irradiates the UV light to transfer the circuit pattern onto the wafer. Step 16 (etching) uses reactive ion etching (RIE) to complete the patterning operation. Step 17 (resist stripping) removes disused resist after etching. Thus, devices (i.e., semiconductor chips, LCD devices, photographing devices (such as CCDs, etc.), thin-film magnetic heads, and the like) are fabricated. These steps are repeated, and multi-layer circuit patterns are formed on the wafer. Thus, the device manufacturing method using the nanoimprint technology of this embodiment, and devices as a resultant product constitute one aspect of this invention. The present invention intends to cover devices as intermediate and final products of this device manufacturing method. Such devices include semiconductor chips such as LSI, VLSI and the like, CCDs, LCDs, magnetic sensors, thin film magnetic heads, and the like.

Further, the present invention is not limited to these preferred embodiments, and various variations and modifications may be made without departing from the scope of the present invention.

This application claims a foreign priority benefit based on Japanese Patent Application No. 2005-266195, filed on Sep. 14, 2005, which is hereby incorporated by reference herein in its entirety as if fully set forth herein.

What is claimed is:

1. A processing method for transferring a relief pattern of a mold to a resist on a substrate, said processing method comprising:
   a compressing step of compressing the mold against the resist;
   a curing step of curing the resist by irradiating an exposure light onto the resist through the mold;
   a vibrating step of applying a vibration to at least one of the mold or the substrate while irradiating the exposure light; and
   a releasing step of releasing the mold from the resist.

2. A processing method according to claim 1, wherein said vibrating step includes adjusting at least one of a frequency or an amplitude of the vibration based on at least one of a characteristic of the resist or a shape of the relief pattern.

3. A processing method according to claim 1, further comprising:
   an exposure determining step of determining whether an exposure dose of the exposure light is a predetermined amount,
   wherein said vibrating step starts the application of the vibration when said exposure determining step determines that the exposure dose is the predetermined amount.

4. A processing method according to claim 1, the vibration in said vibrating step includes two or more types of vibrations having different frequencies or amplitudes or both.

5. A processing method according to claim 1, further comprising:
   a magnification adjusting step of adjusting a magnification of the relief pattern,
   wherein members used in said the magnification adjusting step are used in said vibrating step.

6. A processing method according to claim 1, further comprising an impact applying step of applying an impact to at least one of the mold or the substrate.

7. A processing method according to claim 1, wherein the vibrating step starts the application of the vibration before the curing step starts irradiating the exposure light, and ends the application of the vibration after the curing step ends irradiating the exposure light.

8. A processing method according to claim 1, further comprising:
   a compression determining step of determining whether a compression state in said compressing step is a predetermined state,
   wherein said vibrating step starts the application of the vibration when said compression determining step determines that the compression state is the predetermined state.

9. A processing method according to claim 8, wherein the compression state includes at least one of a compression force between the mold and the resist or an interval between the mold and the substrate.

10. A processing method for transferring a relief pattern of a mold to a resin on a substrate, the processing method comprising:

a compressing step of compressing the mold against the resin;

a curing step of curing the resin;

a vibrating step of applying a vibration to at least one of the mold or the substrate; and a releasing step of releasing the mold from the resin, wherein the vibrating step starts the application of the vibration before the curing step starts curing the resin.

11. A processing method according to claim 10, wherein the vibrating step ends the application of the vibration after the curing step ends curing the resin.

* * * * *